United States Patent [19]
Cory

[11] Patent Number: 5,260,654
[45] Date of Patent: Nov. 9, 1993

[54] TECHNIQUE FOR AMPLITUDE ALIGNMENT OF NMR SPECTROMETER USING MULTIPLE PULSE SEQUENCE THAT IS INDEPENDENT OF RF INHOMOGENEITY

[75] Inventor: David G. Cory, Boston, Mass.
[73] Assignee: Bruker Instruments, Inc., Billerica, Mass.
[21] Appl. No.: 860,449
[22] Filed: Mar. 30, 1992
[51] Int. Cl.⁵ .............................. G01N 33/20
[52] U.S. Cl. .................... 324/309; 324/307; 324/313
[58] Field of Search ............. 324/307, 309, 313, 314

[56] References Cited

U.S. PATENT DOCUMENTS

| | | | |
|---|---|---|---|
| 4,694,254 | 9/1987 | Vatis et al. | 324/313 |
| 4,739,267 | 4/1988 | Leroux et al. | 324/307 |
| 4,739,268 | 4/1988 | Fox | 324/314 |
| 4,788,501 | 11/1988 | Leroux et al. | 324/314 |
| 4,799,014 | 1/1989 | Nakabayashi | 324/314 |
| 4,866,386 | 9/1989 | Sattin | 324/314 |
| 4,983,921 | 1/1991 | Kramer et al. | 324/309 |

OTHER PUBLICATIONS

U. Haubenreisser et al, "Accurate Phase Adjustment for Multiple Pulse NMR of Solids", J. of Magnetic Resonance, vol. 35, pp. 175-184, 1979.
A. J. Shaka et al, "Multiple-Pulse Sequences for Precise Transmitter Phase Alignment", J. of Magnetic Resonance, vol. 80, pp. 96-111, 1988.
B. C. Gerstein et al, "Transient Techniques in NMR of Solids", Academic Press, pp. 215-220, 1985.

*Primary Examiner*—Michael J. Tokar
*Assistant Examiner*—Raymond Y. Mah
*Attorney, Agent, or Firm*—Cesari and McKenna

[57] ABSTRACT

The quadrature channels of an RF generator in an NMR spectrometer are aligned relative to one another by applying pulse sets to pairs of channels that are 180° out of phase. The effect of the pulses in one channel is the opposite of the pulses in the other channel. As a result, the magnetization of the sample returns to the direction in which it started when the amplitudes of the pulses applied to each channel are equal. The magnetization returns to the initial direction even in the presence of RF inhomogeneities. The characteristic magnetization pattern can be easily observed and used to adjust the relative pulse amplitudes equal and the absolute pulse amplitudes to $\pi/2$.

22 Claims, 9 Drawing Sheets

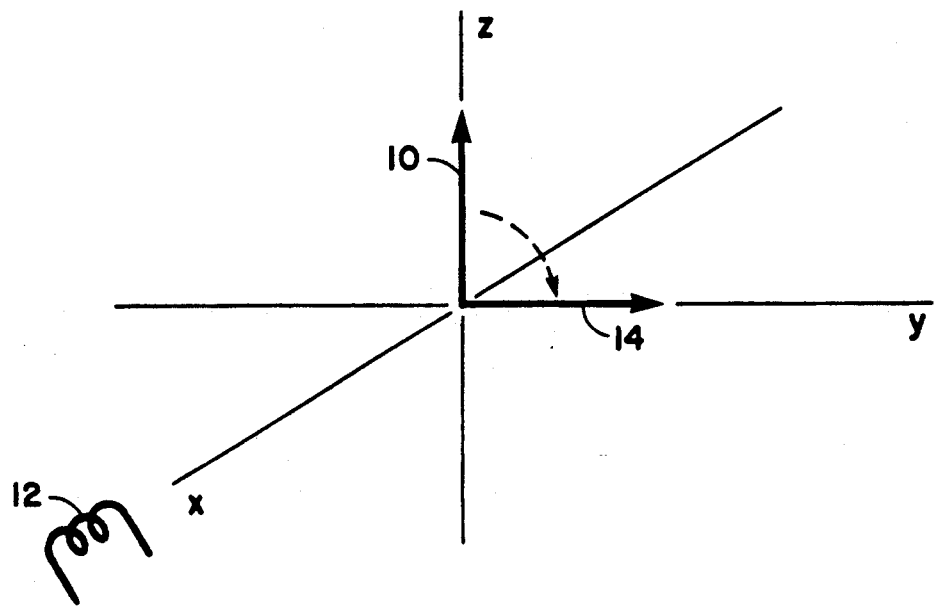
_Fig. 1_
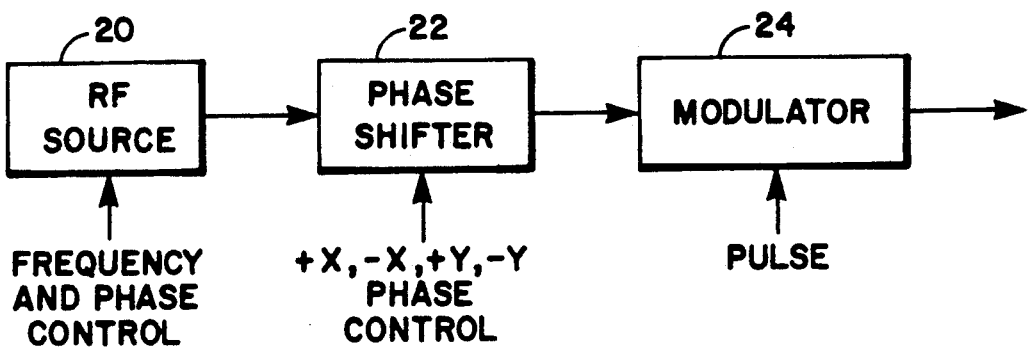
_Fig. 2_

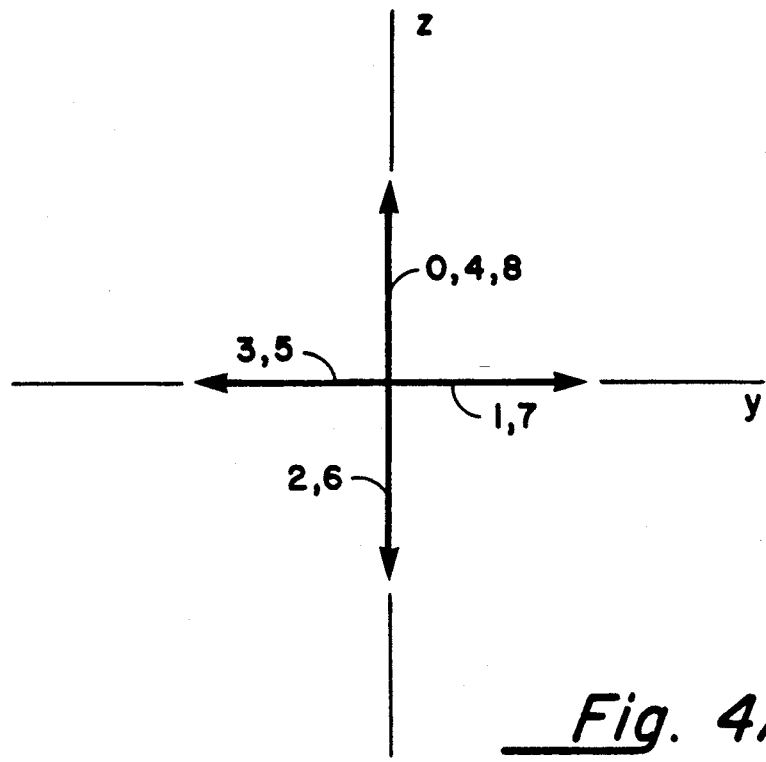
_Fig. 4A_
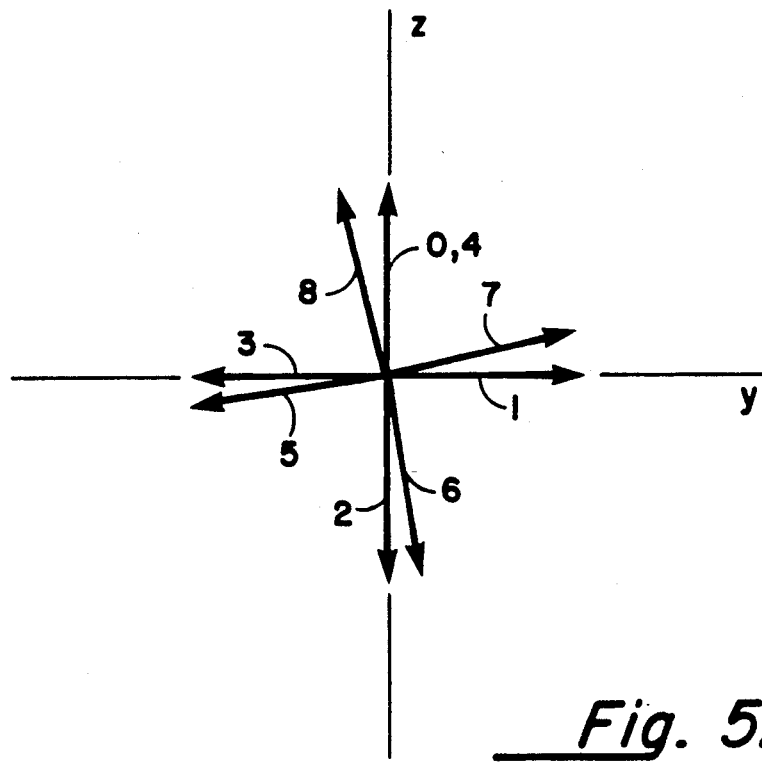
_Fig. 5A_

................ 36
.. .. .. .. .. ( .. .. .. .. .. .. .. .. .. .. .. .

................ 40
............................ ( ..............................

................ 38
.. .. .. .. .. .. ( .. .. .. .. .. .. .. .. .. .. .. ..

$$\left(\frac{\pi}{2}\right)_x , \left(\frac{\pi}{2}\right)_{-x}$$

1% ERROR ON $\left(\frac{\pi}{2}\right)_{-x}$ $\left(-5\% \text{ ERROR ON } \frac{\pi}{2}\right)_{-x}$ $\left(+1\% \text{ ERROR } \frac{\pi}{2}\right)_{x}, \left(-1\% \text{ ERROR } \frac{\pi}{2}\right)_{-x}$ $\left(1\% \text{ ERROR ON BOTH } \left(\frac{\pi}{2}\right)_x \text{ AND } \left(\frac{\pi}{2}\right)_{-x}\right.$

*Fig. 7A*

$\left(5\% \text{ ERROR ON BOTH } \left(\frac{\pi}{2}\right)_x \text{ AND } \left(\frac{\pi}{2}\right)_{-x}\right.$

*Fig. 7B*

$\left(\frac{\pi}{2}\right)_x$ , $\left(\frac{\pi}{2}\right)_{-x}$ w/5° PHASE ERROR

*Fig. 8A*

$\left(\frac{\pi}{2}\right)_x$ , $\left(\frac{\pi}{2}\right)_{-x}$ w/20° PHASE ERROR

*Fig. 8B*

$\left(+1\% \text{ ERROR } \frac{\pi}{2}\right)_x, \left(-1\% \text{ ERROR } \frac{\pi}{2}\right)_{-x}, 5° \text{ PHASE ERROR}$

TECHNIQUE FOR AMPLITUDE ALIGNMENT OF NMR SPECTROMETER USING MULTIPLE PULSE SEQUENCE THAT IS INDEPENDENT OF RF INHOMOGENEITY

FIELD OF THE INVENTION

This invention relates to NMR spectroscopy and, more particularly, to a radio frequency (RF) pulse sequence for precisely aligning RF amplitudes of different phase RF pulses in a manner that is independent of the RF field inhomogeneity, and in a manner that allows the amplitudes of the different phase RF pulses to be accurately set equal to each other.

BACKGROUND OF THE INVENTION

Many nuclei possess a magnetic moment. Nuclear magnetic resonance (NMR) is a phenomenon exhibited by this select group of atomic nuclei (termed "NMR active" nuclei), and is based upon the interaction of the nucleus with an applied, external magnetic field. The magnetic properties of a nucleus are conveniently discussed in terms of two quantities: the magnetogyric ratio ($\gamma$) and the nuclear spin (I). When an NMR active nucleus is placed in a magnetic field, its nuclear magnetic energy levels are split into $(2I+1)$ non degenerate energy levels that are separated from each other by an energy that is directly proportional to the strength of the applied magnetic field. This splitting is called the "Zeeman" splitting and is equal to $\gamma h H_0/2\pi$, where h is Planck's constant and $H_0$ is the strength of the magnetic field. The frequency corresponding to the energy of the Zeeman splitting ($\omega_0 = \gamma H_0$) is called the "Larmor frequency". When a bulk sample containing NMR active nuclei is placed within a magnetic field, the nuclear spins distribute themselves among the nuclear magnetic energy levels in accordance with Boltzmann's statistics. This results in a population imbalance between the energy levels and a net nuclear magnetization. It is this net nuclear magnetization that is studied by NMR. Typical NMR active nuclei include $^1H$ (protons), $^{13}C$, $^{19}F$, and $^{31}P$ For these four nuclei $I=\frac{1}{2}$, and each nucleus has two nuclear magnetic energy levels.

At equilibrium, the net nuclear magnetization is aligned with the external magnetic field and is time-independent. A second magnetic field perpendicular to the first and rotating at or near the Larmor frequency induces a coherent motion (a "nutation") of the net nuclear magnetization. Since, at conventional field strengths, the Larmor frequency is in the MHz range, this second field is called a "radio frequency field" (RF field). The effect of the RF field is to rotate the spin magnetization about the direction of the applied RF field. By convention, an RF pulse of sufficient length to nutate the nuclear magnetization through an angle of 90°, or $\pi/2$ radians, is called a "$\pi/2$ pulse".

A $\pi/2$ pulse applied near resonance will rotate the spin magnetization that was along the external magnetic field direction to a plane perpendicular to the external magnetic field. The component of the net magnetization that is transverse to the external magnetic field precesses about the external magnetic field at the Larmor frequency. This precession can be detected with a resonant coil placed such that the precessing magnetization induces a voltage across the coil. Frequently, the "transmitter coil" employed for nutating the spin magnetization and the "receiver coil" for detecting the magnetization are one and the same.

In addition to precessing at the Larmor frequency, the magnetization also undergoes two relaxation processes: (1) dephasing within the transverse plane ("spin-spin relaxation") with an associated relaxation time, $T_2$, and (2) a return to the equilibrium population of the nuclear magnetic energy levels ("spin lattice relaxation") with an associated relaxation time, $T_1$.

The nuclear magnetic moment experiences an external magnetic field that is reduced from the actual field due to a screening from the surrounding electron cloud. This screening results in a slight shift of the Larmor frequency (called the "chemical shift" since the size and symmetry of the shielding is dependent on the chemical composition of the sample). This shift is often of interest because it reveals information about the structure of the sample molecules.

In addition to the applied external magnetic field, the nuclei are also subject to local magnetic fields such as those generated by other nearby nuclear magnetic moments and electron magnetic moments. Interactions between these magnetic moments are called "couplings", and one important example of such couplings is the "dipolar" coupling. In solids, the NMR spectra of spin=$\frac{1}{2}$ nuclei are often dominated by dipolar couplings, and in particular by dipolar couplings to adjacent protons. When the couplings are between nuclei of like kind, these couplings are called homo nuclear couplings. Generally, the effects of these couplings are undesirable because they obscure more interesting, but weaker, phenomena, such as the chemical shifts mentioned above.

In order to reduce the effect of such couplings, a class of experiments employs multiple pulse coherent averaging to continuously modulate the internal Hamiltonians such that, in an interaction frame, selected Hamiltonians are scaled. A sub class of such experiments is designed to reduce the effects of homo nuclear dipolar couplings by reducing the dipolar Hamiltonian to zero in this interaction frame. The most widely used group of these latter experiments consists of long trains of RF pulses applied in quadrature. Data is sampled between groups of pulses. Since upwards of 2,000 RF pulses are applied for a single acquisition, the RF pulses must be carefully aligned to avoid propagation errors.

Four quadrature channels are typically utilized for applying the RF pulses to a sample. By convention, the main static magnetic field is applied along the Z axis, producing a precession of the nuclear spins about the Z axis. In order to more easily discuss the RF pulses, they are normally referenced to a coordinate frame which rotates. The rotating frame is produced by transforming the stationary laboratory coordinate system to a coordinate system that rotates about the Z axis at the Larmor frequency, so transverse magnetization from a spin that is exactly on resonance will appear static in the rotating frame.

The RF pulses are applied to the sample via a coil that produces an oscillating magnetic field that is oriented transverse to the main magnetic field. In the rotating frame, the RF field can be decomposed into components that rotate with the frame and which rotate counter to the frame rotation. The counter rotating component is generally discarded since it is far removed from resonance. So although a single RF coil is employed, the orientation of the RF field (now a static field in the rotating frame) can be varied by a phase shift.

When the RF energy is applied, the nuclear spins rotate an amount depending on the amplitude and length of the RF pulse. The RF pulse length is typically measured by referring to the angle through which the spins are rotated during the application of the RF energy. This latter angle is commonly referred to as a "tip angle". A typical tip angle or pulse length is $\pi/2$.

RF pulses are never perfect, but the errors have effects of varying severity. The most serious errors are those which result in tip angle deviations from the four quadrature phases (either a miss-setting of the pulse length or of the RF field amplitude) and transient effects associated with the finite rise and fall times of the pulse.

Tip-angle errors can take two forms: (1) the four quadrature RF pulses are set accurately to the same length, but this length deviates from the ideal length of $\pi/2$; and (2) the length of one or more of the four quadrature pulses deviates from $\pi/2$ so that the pulses are not of equal length. The second class of errors is more deleterious to line-narrowing experiments than the first.

Since, as previously mentioned, a large number of RF pulses are used for each acquisition, a normal design criterion for the construction of RF pulse cycles is to arrange them to be somewhat self-compensating for common errors mentioned above. Due to symmetries present in the conventional solid echo pulse pair from which most longer cycles are constructed, known cycles are well compensated for a uniform miss-setting of the RF pulse length (which results in a tip angle of other than $\pi/2$). Therefore, it is more important to insure that the tip-angles produced by the four quadrature pulses are equal to each other than to insure that the tip-angle produced by each pulse be exactly $\pi/2$.

Present day NMR spectometers generate the basic RF energy from a direct digital synthesizer (DDS) that allows flexible control of both the phase and frequency of the RF energy. For many experiments, the DDS control of the phases is adequate (for instance, virtually all liquid state experiments use only DDS control). However, for the above mentioned homonuclear dipolar decoupling experiments, the phase accuracy and switching speed of the DDS is generally not adequate, and a second analog phase shifter, or quadrature multiplexer is therefore included in series with the output from the DDS. This quadrature multiplexer can very quickly and reproducibly switch the phase of the RF energy between four predetermined settings, thereby producing the required four quadrature channels from a single DDS setting. Since the gating circuit normally used in the multiplexer generally treats all four quadrature pulses nearly the same, the aforementioned tip-angle errors are generally due to errors in the setting of the RF pulse amplitude and not due to miss setting of the RF pulse length.

Consequently, though the conventional quadrature multiplexer is extremely robust and stable, it must be initially aligned so that the RF phases are in quadrature and so that the four RF amplitudes produce a tip angle of exactly $\pi/2$. This disclosure discusses a new approach to amplitude alignment.

A prior art technique for amplitude alignment is described by B. C. Gerstein et al. in *Transient Techniques in NMR of Solids,* Academic Press, Orlando, 1985, pp. 215-220. According to this technique, four $\pi/2$ X pulses are applied, via a single quadrature channel, on resonance to the nuclei of a sample and the magnetization is observed along the Y axis. The four $\pi/2$ pulses cause the nuclear spins to be rotated successively to positions 90°, 180°, 270° and 0° from the original Z-axis, and in the Y, Z plane. Data samples are taken between pulses so that the data sampling is effectively at one half of the Nyquist frequency. This sampling rate produces a well-known pattern if the pulse amplitudes are proper. Consequently, the observed magnetization along the Y axis can be used to adjust the RF pulse amplitudes until the pattern appears.

Although it provides no comparison between the amplitudes in different channels, this prior art technique is generally satisfactory for setting the amplitude in a single channel in situations when the RF field is homogeneous over the volume of the sample. For example, in combined rotation and multiple pulse spectroscopy (CRAMPS) experiments, data is normally taken with small spherical samples which occupy very little of the RF coil volume, thereby increasing the RF homogeneity across the sample. In this situation, satisfactory results are obtained with the above-described technique.

However, the prior art technique suffers from two drawbacks. More particularly, in newer applications of multiple pulse techniques, including two-dimensional heteronuclear work and solid state imaging, conditions dictate that the RF field is less homogeneous over the sample volume than in previous experiments.

When the RF homogeneity over the volume of the sample is relatively poor, and the above-described prior art alignment method is used, the magnetization observed during application of the four pulse sequence rapidly decays to zero. As a result, amplitude alignment is difficult and imprecise because the signal decays so rapidly that it is difficult to observe the pattern which is used to adjust the alignment.

Also, with the prior art, the RF amplitudes of the four quadrature channels are set individually to a nominal value of $\pi/2$ without any effort to set them equal to one another. When they are accurately set to $\pi/2$, the residual errors are not very important, but when RF inhomogeneity limits the accuracy of the amplitude setting, the errors are scattered about the $\pi/2$ value and are not the same from channel to channel.

These problems are particularly apparent in solid state imaging, where the trend is to use larger samples and to use as small an RF coil as possible to preserve the RF field strength and to obtain a higher signal-to-noise ratio. The RF inhomogeneity in such conditions is much worse than would be acceptable for CRAMPS work and the prior art alignment technique is difficult to use. However, if the RF fields in the quadrature pulses can accurately aligned at any point in time, such as the beginning of the experiment, then good results are still obtained.

It is a general object of the present invention to provide improved methods for RF field amplitude alignment in an NMR spectrometer.

It is another object of the present invention to provide a method for RF field amplitude alignment in an NMR spectrometer such that the four quadrature RF channels are accurately set to the same amplitude.

It is yet another object of the present invention to provide methods for RF field amplitude alignment in an NMR spectrometer which are independent of RF field inhomogeneity.

It is a further object of the present invention to provide methods for RF field amplitude alignment in an NMR spectrometer which are highly precise and easy to use.

It is still another object of the present invention to provide methods for RF field amplitude alignment in an NMR spectrometer used for two-dimensional heteronuclear experiments, solid state imaging, and other applications requiring a relatively large sample.

SUMMARY OF THE INVENTION

The foregoing objects are achieved and the foregoing problems are solved in one illustrative embodiment of the invention in which two channels are aligned relative to one another by sequentially applying pulse sets to each channel. The effect of the pulses in one channel is the opposite of the pulses in the other channel. As a result, the magnetization of the sample returns to the direction in which it started when the amplitudes of the pulses applied to each channel are equal. The magnetization returns to the initial direction even in the presence of RF inhomogeneities. The characteristic magnetization pattern can be easily observed and used to adjust the relative pulse amplitudes and the absolute pulse amplitudes to $\pi/2$.

More particularly, a pair of channels that are normally 180° out of phase are chosen for the alignment procedure. An RF pulse set is placed on one channel, which pulse set rotates the nuclear spins in a first direction a predetermined amount. A second, similar RF pulse set is applied to the other channel. Since this second channel is 180° out of phase with the first channel, the second set of pulses rotates the nuclear spins in a direction opposite to the first direction. If the pulse amplitudes are aligned relative to one another, the spins will end in the same position at which they started, thereby producing a characteristic magnetization pattern. However, if the pulses are not aligned, the magnetization pattern can be used to align the pulses.

It is advantageous to align all channels to a single channel. In order to align the channels which are 90° out of phase with the initial channel, an additional phase change is introduced from the DDS such that the overall phase change is 180° even though the phase change for each channel is only 90°.

Preferably, the pulse sequence comprises four positive $\pi/2$ pulses on one channel followed by four negative $\pi/2$ pulses on the other channel. The pulse sequence is applied to the nuclei continuously for a predetermined time and the nuclei step between the discrete magnetization levels. When the preferred pulse sequence is utilized, a zero magnetization level corresponds to the initial position of the nuclei o to rotation from the initial position by 180°, a first magnetization level corresponds to rotation of the nuclei from the initial position by 90°, and a second magnetization level corresponds to rotation of the nuclei from the initial position by 270°. The second magnetization level is equal in magnitude and opposite in polarity with respect to the first magnetization level. When the amplitudes of the first and second pulse sets are equal, the first, second and zero magnetization levels remain constant as the pulse sequence is repeated.

The above cycle consisting of four $+X$ pulses followed by four $-X$ pulses is optimal where the RF inhomogeneity is very poor and the main interest is in setting the four quadrature amplitudes equal. In general, the cycle can consist of $4n+X$ pulses followed by $4n-X$ pulses. A longer string of $+X$ pulses allows the RF amplitude to be more accurately set to $\pi/2$, and a longer repetition of 4-pulse strings allows the RF amplitudes to be more accurately set equal to one another. In practice, it may be beneficial to use both approaches in finding the optimal alignment of the quadrature multiplexer.

BRIEF DESCRIPTION OF THE DRAWINGS

For a better understanding of the present invention, together with other and further objects, advantages and capabilities thereof, reference is made to the accompanying drawings which are incorporated herein by reference and in which:

FIG. 1 is a perspective view of a three dimensional coordinate system used to describe the present invention;

FIG. 2 is a block diagram of an RF pulse generator used in an NMR spectrometer;

FIG. 4A illustrates rotation of nuclear spins about the X axis using the pulse sequence of FIG. 3 when the amplitudes are aligned;

FIG. 5A illustrates rotation of nuclear spins about the X axis using the pulse sequence of FIG. 3 when the amplitudes are misaligned;

FIG. 7A is a timing diagram that illustrates magnetization $M_y$ as a function of time for the case of a systematic missetting of $+X$ and $-X$ pulses wherein both pulse sets have a $+1\%$ error;

FIG. 7B is a timing diagram that illustrates magnetization $M_y$ as a function of time wherein the $+X$ and $-X$ pulses both have a $+5\%$ error;

FIG. 8A is a timing diagram that illustrates magnetization $M_y$ as a function of time for the case of a 5° phase error between the $+X$ and $-X$ pulses;

FIG. 8B is a timing diagram that illustrates magnetization $M_y$ as a function of time for the case of a 20° phase error between the $+X$ and $-X$ pulses;

DETAILED DESCRIPTION OF THE INVENTION

Figure 3:
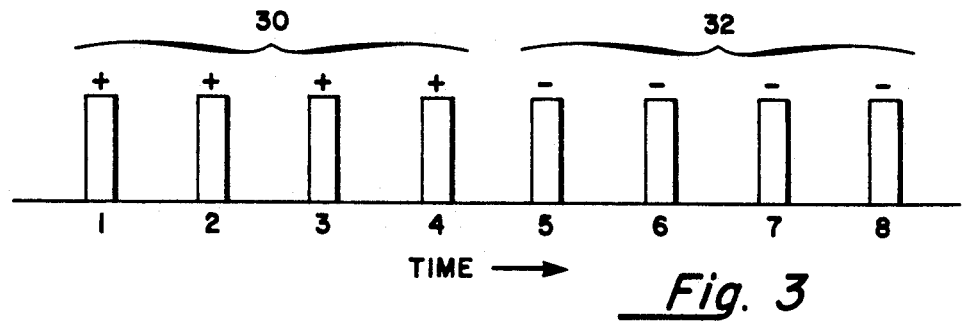
FIG. 3 is a timing diagram showing an RF pulse sequence used for amplitude alignment in accordance with the present invention.

A coordinate system used to describe the present invention is shown in FIG. 1. In a nuclear magnetic resonance (NMR) spectrometer, a sample containing NMR active nuclei is placed in a main static magnetic field aligned in the direction of a Z axis. The nuclear spins of the NMR active nuclei align with the main magnetic field as indicated by the vector 10 in FIG. 1. The spectrometer includes four quadrature channels for applying pulsed radio frequency (RF) fields along $+X$, $-X$, $+Y$ and $-Y$ axes. The quadrature RF fields are applied by a single RF coil 12 that surrounds the sample. The direction and polarity of the RF fields are controlled by controlling the phases of the RF signals applied to RF coil 12.

As is well known in the art, the pulsed RF fields cause the nuclear spins to rotate, with the amount of rotation depending on the RF field amplitude and pulse length. As previously mentioned, by convention, an RF pulse of suitable amplitude and pulse length to rotate the nuclear spins by 90° is known as a $\pi/2$ pulse. In FIG. 1, a $\pi/2$ pulse along the $+X$ axis causes the nuclear spins to rotate from the equilibrium position indicated by vector 10 about the X axis by 90° into alignment with the Y axis, as indicated by the vector 14. A suitable NMR spectrometer for practicing the present invention is the Model ASX, sold by Bruker Instruments, Inc.

As noted above, it is important that the four channels used to apply pulsed RF fields to the sample be accurately aligned in amplitude and phase. A simplified block diagram of the RF pulse generator is shown in FIG. 2. An RF source 20, typically a direct digital synthesizer, supplies a continuous wave RF signal to a phase shifter 22, typically a quadrature modulator. The DDS is under computer control and can vary both the frequency and phase of the RF energy delivered to phase shifter 22. The output of the DDS together with a phase control signal applied to the phase shifter 22 determines the overall phase of the pulsed RF field applied to the sample. The output of the phase shifter 22 is input to a modulator 24 that forms an RF pulse of the desired pulse length in response to a pulse control signal. The output of the modulator 24 is applied to RF coil 12. To generate the $+X$, $-X$, $+Y$ and $-Y$ RF fields, the phase of the RF signal is appropriately phase shifted. The phase shifter 22 output typically varies somewhat in amplitude as a function of the output phase. As a result, the amplitudes of the pulsed RF fields in the four channels may not be equal. The modulator 24 is typically very stable, but must be initially aligned at least once and often at the start of a very critical or demanding experiment.

The conventional alignment procedure includes: 1) setting the RF amplitudes of each channel to a predetermined strength with a train of $\pi/2$ pulses as described in the aforementioned reference by B. C. Gerstein et al., $$\left[\left(\frac{\pi}{2}|\right)_x - \left(\frac{\pi}{2}\right)_x - \left(\frac{\pi}{2}\right)_x - \left(\frac{\pi}{2}\right)_x - \right]_n$$

2) setting the four RF phases to be in quadrature with the Haubenreisser-Schnabel cycle as described in *Journal of Magnetic Resonance*, Vol. 35, page 175, 1979

$$\left[\left(\frac{\pi}{2}\right)_x - \left(\frac{\pi}{2}|\right)_\phi - \left(\frac{\pi}{2}\right)_\phi - \left(\frac{\pi}{2}\right)_x - \right]_n$$

and, 3) tuning out the phase transients with the flip-flop cycle as described in the aforementioned reference by B. C. Gerstein et al.

$$\left[\left(\frac{\pi}{2}\right)_x - \left(\frac{\pi}{2}|\right)_{-x}\right]_n$$

and then repeating the process to check for consistency. For an on-resonance sample with a homogeneous RF coil, the conventional approach works well.

Poor RF homogeneity greatly limits the time over which the response to a train of nominal $\pi/2$ pulses can be followed. This experiment is essentially a nutation experiment for measuring the RF field strength with the sampling rate set to half of the Nyquist frequency to yield an easily recognizable pattern. Any dispersion in the RF field strength is reflected as a shift in the nutation frequency and causes the overall pattern to decay more quickly. However, accurate setting of the RF amplitudes requires the pattern to continue for a large number of pulses.

The phases of the four channels can be straightforwardly placed in quadrature using the Haubenreisser-Schnabel approach. This cycle is compensated for RF homogeneity but, as discussed by Shaka et al in *Journal of Magnetic Resonance*, Vol. 80, page 96, 1988, an incorrectly set $\pi/2$ pulse length leads to a systematic missetting of the phase shifts to less than 90°. Thus, even though the Haubenreisser-Schnabel cycle allows the four quadrature phases to be accurately set, the pulse amplitudes must be set correctly first.

The flip-flop cycle is insensitive to the mean length of the $+X$ and $-X$ pulses, but is sensitive to phase errors. In addition, it is sensitive to the difference in a length between the $+X$ and $-X$ pulses.

Overall, when the RF homogeneity is poor, the amplitudes cannot be set to the desired precision, and these missettings propagate through the settings of both the phases and phase transients.

A pulse sequence for aligning amplitudes in accordance with the present invention is shown in FIG. 3. The pulse sequence comprises a symmetric arrangement of a first RF pulse set 30 including four $+X$ pulses followed by a second RF pulse set 32 including four $-X$ pulses. Each pulse is nominally a $\pi/2$ pulse, and the time between pulses is set for convenient sampling of data and to provide a reasonably long string of pulses before the magnetization decays due to spin-spin relaxation. The time between pulses is typically 100 microseconds. Alternatively, pulse sets 30 and 32 can each contain multiples of four $\pi/2$ RF pulses. The pulse sequence is repeated continuously for a sufficient time to permit amplitude alignment.

Figure 4B:
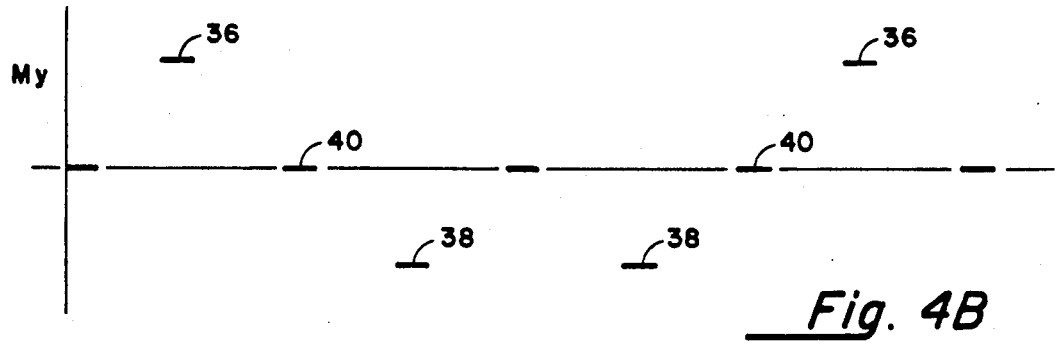
FIG. 4B is a timing diagram showing the Y axis magnetization $M_y$ produced by the pulse sequence of FIG. 3 when the amplitudes are aligned.
Figure 5B:
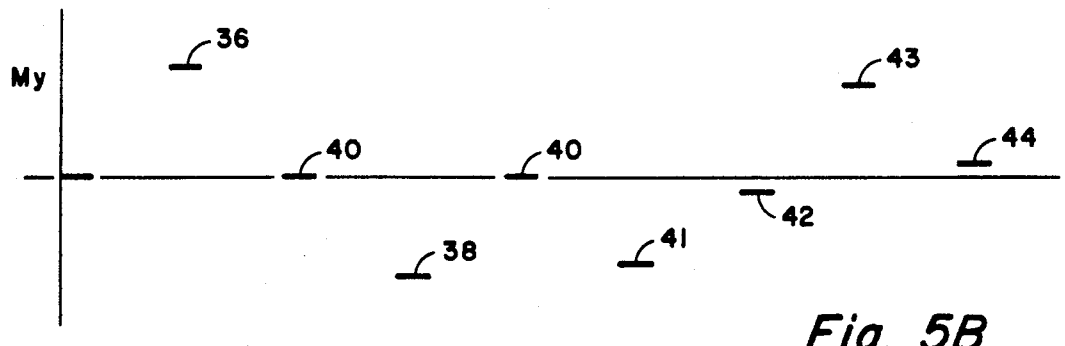
FIG. 5B is a timing diagram showing the Y axis magnetization $M_y$ produced by the pulse sequence of FIG. 3 when the amplitudes are misaligned.

The operation of the amplitude alignment pulse sequence of the invention is illustrated in FIGS. 4A and 4B for the case where the amplitudes are equal and in FIGS. 5A and 5B for the case where the amplitudes are not equal. In FIG. 4A, the orientation of the nuclear spins is illustrated after each pulse in the pulse sequence. The pulses in the pulses sequence are numbered in FIG. 3, and the corresponding position of the nuclear spins after each pulse is indicated in FIG. 4A. In the initial equilibrium position, the nuclear spins are aligned in the direction of the Z axis. Pulse 1 rotates the nuclear spins by 90° in a clockwise direction into alignment with +Y axis. Similarly, pulses 2, 3 and 4 of the first set 30 rotate the nuclear spins to 180°, 270° and 0° with respect to the initial position. The second pulse set 32 rotates the nuclear spins in the reverse or counterclockwise direction about the X axis to the same positions and returns the nuclear spins to the initial position in alignment with the Z axis. The values of Y axis magnetization $M_y$ after each RF pulse are indicated in FIG. 4B. It is seen that the magnetization $M_y$ has three values: a positive value 36 after pulses 1 and 7, a negative value 38 after pulses 3 and 5, and a zero value 40 after pulses 2, 4, 6 and 8. The positive and negative values are equal in magnitude.

Referring now to FIG. 5A, the positions of the nuclear spins when the amplitudes of the first pulse set 30 and the second pulse set 32 are not equal are shown. Pulses 1–4 cause rotation of the nuclear spins to 90°, 180°, 270° and 0° in the same manner shown in FIG. 4A. The second pulse set 32 in this example is larger in amplitude and causes rotation of the nuclear spins by more than 90° in the reverse direction, as indicated by magnetization vectors 5, 6, 7 and 8. In this case, the nuclear spins do not return to the initial equilibrium position. The corresponding values of Y axis magnetization $M_y$ are shown in FIG. 5B. It is seen that the values 41–44 of magnetization $M_y$ produced by the second pulse set 32 are different from the values 36, 38, 40 produced by the first pulse set 30. In general, the values of Y axis magnetization $M_y$ vary as a function of time when the RF pulse amplitudes are not equal. This effect is described in more detail below.

Figures 6A, 6B:
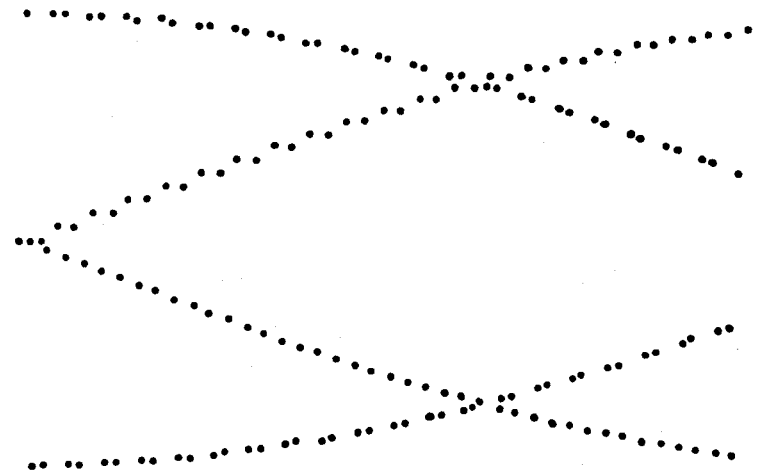
FIG. 6A is a timing diagram that illustrates magnetization $M_y$ as a function of time when the first and second pulse sets are aligned.
FIG. 6B is a timing diagram that illustrates magnetization $M_y$ as a function of time for the case of a $-1\%$ error on the $-X$ pulses.
Figure 6C:
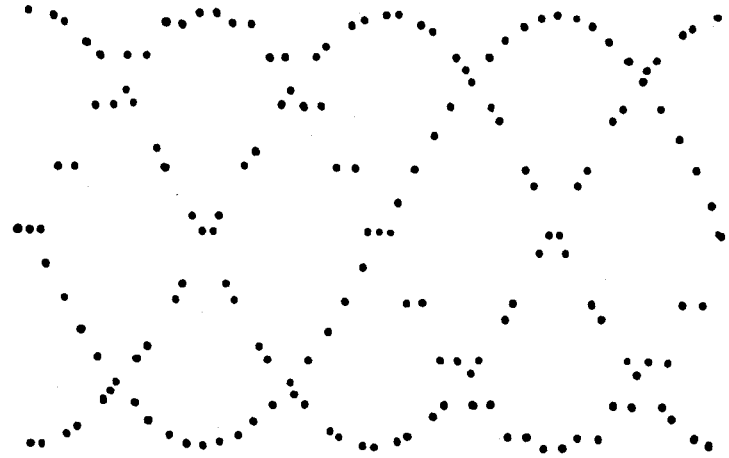
FIG. 6C is a timing diagram that illustrates magnetization $M_y$ as a function of time for the case of a $-5\%$ error on the $-X$ pulses.
Figure 6D:
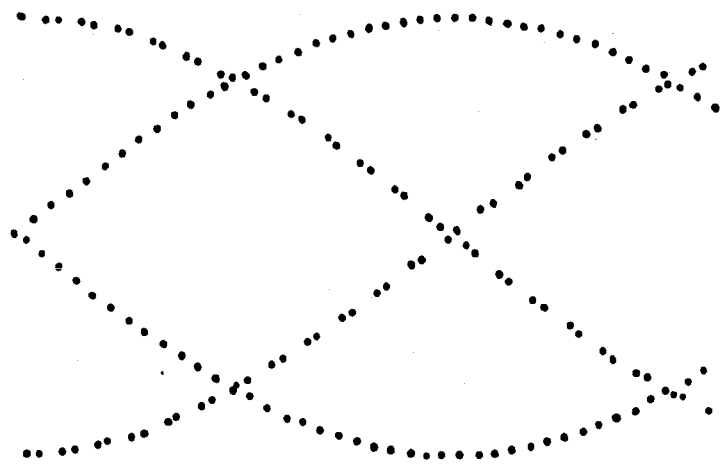
FIG. 6D is a timing diagram that illustrates magnetization $M_y$ as a function of time for the case of a $+1\%$ error on the $+X$ pulses and a $-1\%$ error on the $-X$ pulses.

Simulated results produced by the amplitude alignment pulse sequence of the invention are shown in FIGS. 6A–6D, 7A, 7B and 8A–8C. In each case, the Y axis magnetization $M_y$ is plotted as a function of time, with the magnetization $M_y$ being sampled between pulses. FIG. 6A illustrates the case for equal amplitude +X and −X $\pi/2$ pulses. FIG. 6B illustrates the case for a −1% error on the −X pulses. FIG. 6C illustrates the case for a −5% error on the −X pulses. FIG. 6D illustrates the case for a +1% error on the +X pulses and a −1% error on the −X pulses.

The long term effect of the pulse sequence shown in FIG. 3 can be split into a periodic pattern, dependent on the average pulse amplitude, and a slow oscillation, dependent on the difference in pulse amplitudes. As long as the +X and −X pulses have the same amplitudes and the correct phase, the cycle of eight pulses is cyclic and returns the spin magnetization to the initial equilibrium position aligned with the static magnetic field where it started. When the pulses are accurately set to $\pi/2$ pulses, the pattern shown in FIG. 6A is observed as a uniform three line pattern. The upper line corresponds to the magnetization value 36 shown in FIG. 4B, the lower line corresponds to the magnetization value 38 and the center line corresponds to the zero magnetization value 40.

As the alignment departs from equal amplitude $\pi/2$ pulses, the observed pattern changes in a predictable fashion. When there is a difference in the amplitudes of the +X and −X pulses, both the outer and inner lines oscillate slowly out of phase with each other. The expected patterns are shown in FIGS. 6B, 6C and 6D. The period of the oscillations is solely dependent on the difference in the pulse amplitudes. When the magnetization pattern shown in FIGS. 6B, 6C or 6D is observed, the RF amplitude of one channel is varied until the oscillations vanish. Typically, the RF amplitude is adjusted manually or under software control. Since the rotation of nuclear spins is a function of amplitude and pulse length, either the amplitude or pulse length, or both, can be varied to provide the desired alignment.

The amplitude alignment pulse sequence described thus far utilizes opposite phase (+X and −X) RF pulses. However, all four quadrature pulses must be set accurately in amplitude. Ideally, all channels should be aligned with reference to the same phase, such as +X, so that systematic errors are avoided. This is done by phase shifting the +Y and −Y RF pulses so that they function as −X pulses. Referring to FIG. 2, the RF source 20 is typically a direct digital synthesizer (DDS). The phase of the DDS can be accurately controlled. The pulse sequence shown in FIG. 3 typically has windows of greater than 100 microseconds between pulses. Thus, there is sufficient time to switch the DDS by 90° between the first pulse set 30 and the second pulse set 32. The procedure is as follows. When aligning the +X channel with the +Y or −Y channel, the +X pulses of the first pulse set 30 are generated normally as described above with 0° phase shift by the DDS. During the second pulse set 32, the required phase control signal is applied to phase shifter 22 to generate +Y or −Y pulses. At the same time, the phase of the DDS is shifted by ±90° as required to convert the +Y or −Y pulses to −X pulses. The resultant RF pulses of the second pulse set 32 have the same amplitudes as the +Y or −Y pulses but are shifted in phase so that they affect the nuclei in the same manner as −X pulses. The amplitudes are then adjusted as described above in connection with FIG. 6A–6D.

When the amplitudes have been adjusted to be equal, they still must be set to $\pi/2$. This is accomplished by observing the central line of the magnetization pattern as shown in FIG. 6A. As the pulse lengths depart from the correct settings, the central line of the pattern spreads out as shown in FIGS. 7A and 7B. FIG. 7A illustrates the case where the +X and −X pulses are equal in amplitude but both have a 1% error. FIG. 7B illustrates the case where the +X and −X pulses are equal in amplitude but both have a 5% error. Since the pattern lasts for an extended number of pulses, the amplitudes of the pulses may very accurately be set to $\pi/2$, which provides the pattern shown in FIG. 6A.

Figure 8C:
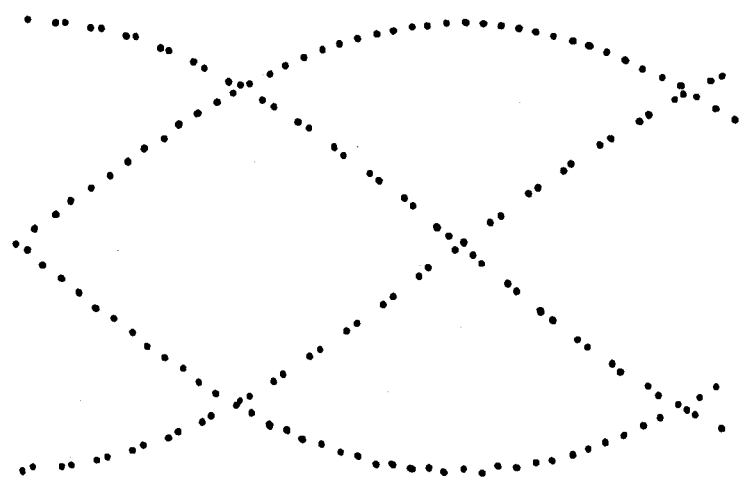
FIG. 8C is a timing diagram that illustrates magnetization $M_y$ as a function of time for the case of a 1% error on the $+X$ pulses, a $-1\%$ error on the $-X$ pulses and a 5° phase error between the $+X$ and $-X$ pulses.

An important consideration with respect to the amplitude adjustment technique of the present invention is the influence of a phase error on the adjustment technique. The effect of a phase error on the observed magnetization pattern is illustrated in FIGS. 8A, 8B and 8C. FIG. 8A shows the case of equal +X and −X amplitudes and a 5° phase error. FIG. 8B shows the magnetization pattern for equal +X and −X amplitudes and a 20° phase error. FIG. 8C shows the pattern for a +1% amplitude error on the +X pulses, a −1% amplitude error on the −X pulses and a 5° phase error. The observed effect of a phase error is extremely small, even for what must be considered huge phase errors.

The overall tuning procedure is to first set the RF amplitudes as accurately as possible using a train of $\pi/2$ pulses. Then the residual errors are corrected using the pulse sequence shown in FIG. 3 and described above. The amplitudes are aligned for each of the four quadrature channels using this technique. After this, the conventional alignment procedure is completed. If large phase errors are present, the procedure can be modified to reduce the phase errors before utilizing the amplitude alignment technique of the invention. However, after the pulse amplitudes have been correctly set, the phases should be readjusted.

Figure 9:
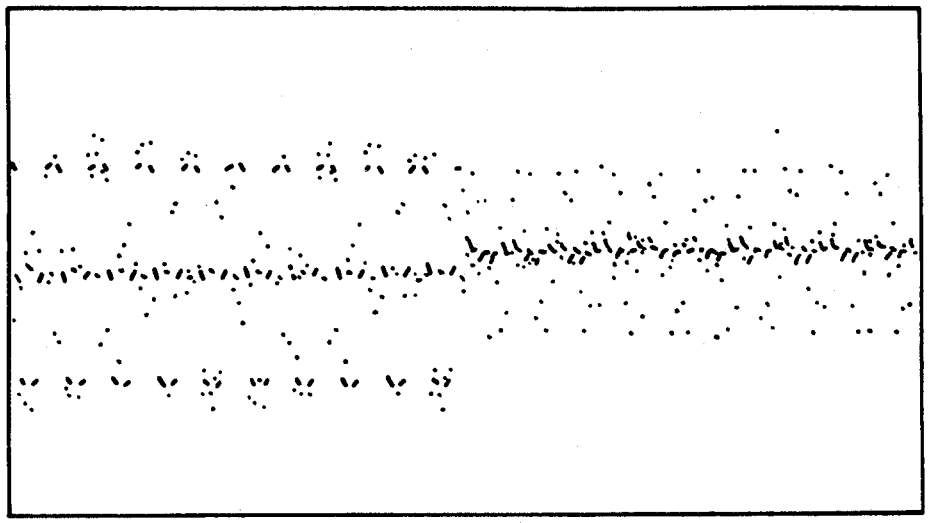
FIG. 9 is timing diagram that illustrates magnetization $M_y$ as a function of time showing the output of an NMR spectrometer when the pulse sequence of the present invention is used and the amplitudes are aligned.

Experimental results obtained with an RF coil having only a modest homogeneity are shown in FIG. 9. The left half of FIG. 9 represents the magnetization pattern $M_y$ using the pulse sequence shown in FIG. 3.

Figure 10:
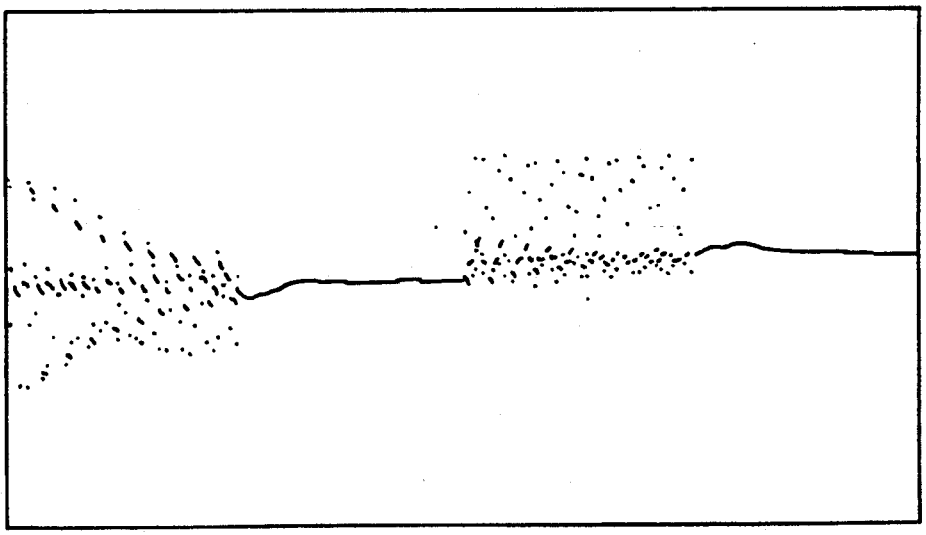
FIG. 10 is a timing diagram that illustrates magnetization $M_y$ as a function of time showing the output of an NMR spectrometer when the prior art alignment technique is used and the amplitudes are aligned.

Typical results obtained with the prior art amplitude alignment technique are illustrated in FIG. 10. The magnetization pattern decays rapidly, thereby making it difficult to accurately align the amplitudes.

While there have been shown and described what are at present considered the preferred embodiments of the present invention, it will be obvious to those skilled in the art that various changes and modifications may be made therein without departing from the scope of the invention as defined by the appended claims.

What is claimed is:

1. In an NMR spectrometer in which NMR-active nuclei are placed in a main static magnetic field and nuclear spins are excited to generate transverse magnetization and further manipulated by at least a first set of RF pulses each having a first amplitude and a second set of RF pulses each having a second amplitude, a method for setting said first pulse amplitude substantially equal to said second pulse amplitude, said method comprising the steps of:
   A. structuring said first RF pulse set to nutate said nuclear spins in a first direction through a first angle which is dependent on said first pulse amplitude;
   B. structuring said second RF pulse set to nutate said nuclear spins in a second direction through a second angle which is dependent on said second pulse amplitude, said second RF pulse set being structured so that said second direction is opposite to said first direction and said second angle is equal to said first angle when said first pulse amplitude is equal to said second pulse amplitude;
   C. periodically sensing said transverse magnetization during said first and second RF pulse sets; and
   D. adjusting said first pulse amplitude based on magnetization sensed in step C.

2. A method as defined in claim 1 wherein said first RF pulse set comprises four $\pi/2$ pulses and said second RF pulse set comprises four $\pi/2$ pulses.

3. A method as defined in claim 1 wherein said first RF pulse set comprises a multiple of four $\pi/2$ pulses and said second RF pulse set comprises a multiple of four $\pi/2$ pulses.

4. A method as defined in claim 1 wherein said first and second RF pulse sets are repeated such that said nuclei continuously step between said discrete magnetization levels.

5. A method as defined in claim 2 wherein the step of sensing said transverse discrete magnetization includes sensing a zero magnetization level corresponding to the initial position of said nuclei or to rotation from the initial position by 180°, a first magnetization level corresponding to rotation of said nuclei from the initial position by 90°, and a second magnetization level corresponding to rotation of said nuclei from the initial position by 270°, the second magnetization level being equal in magnitude and opposite in polarity with respect to said first magnetization level when the amplitudes of the first and second pulse sets are equal.

6. A method as defined in claim 1 wherein said first pulse set has the same amplitude as a pulse used during an experiment to rotate said nuclear spins about a first axis in a positive direction and said second pulse set has the same amplitude as a pulse used during an experiment to rotate said nuclear spins about the first axis in a negative direction.

7. A method as defined in claim 1 wherein said first pulse set has the same amplitude as pulses used during an experiment to rotate said nuclear spins about the first axis and said second pulse set has the same amplitude as pulses used during an experiment to rotate said nuclear spins about a second axis orthogonal to said first axis.

8. A method as defined in claim 7 wherein the step of applying said second pulse set includes the step of forming said second pulse set by generating pulses selected to rotate said nuclear spins about the second axis and shifting the phases of said pulses such that said pulses rotate said nuclear spins about the first axis.

9. A method as defined in claim 5 wherein the step of adjusting said first pulse amplitude includes adjusting the amplitude such that said magnetization levels remain constant as said pulse sequence is repeated.

10. A method as defined in claim 1 further including the step of adjusting the amplitudes of said first and second pulse sets to produce rotation of said nuclear spins by $\pi/2$ radians.

11. In an NMR spectrometer in which NMR-active nuclei are placed in a main static magnetic field and nuclear spins are excited to generate transverse magnetization by an RF transmitter having at least a first channel generating RF pulses each having a first amplitude and a second channel generating RF pulses each having a second amplitude and a phase difference of 180° from RF pulses generated by said first channel, a method for setting said first pulse amplitude substantially equal to said second pulse amplitude, said method comprising the steps of:
   A. applying to said nuclei a first RF pulse set from said first channel, said first RF pulse set nutating said nuclear spins through a first angle which is dependent on said first pulse amplitude;
   B. applying to said nuclei a second RF pulse set from said second channel, said second RF pulse set nutating said nuclear spins through a second angle which is dependent on said second pulse amplitude, said second RF pulse set being selected so that said second angle is equal to said first angle if said first pulse amplitude is equal to said second pulse amplitude;
   C. periodically sensing said transverse magnetization during said first and second RF pulse sets; and
   D. adjusting said first pulse amplitude based on magnetization sensed in step C.

12. A method as defined in claim 11 wherein the step of applying a first RF pulse set includes applying four $+X$ $\pi/2$ pulses, where $+X$ represents an RF pulse selected to rotate said nuclear spins about a first axis by $\pi/2$ radians.

13. A method as defined in claim 12 wherein the step of applying a second RF pulse set includes applying four $-X$ $\pi/2$ pulses, where $-X$ represents an RF pulse selected to rotate said nuclear spins about the first axis by $-\pi/2$ radians.

14. A method as defined in claim 12 wherein the step of applying a second RF pulse set includes applying four $+Y$ or $-Y$ $\pi/2$ pulses, where $+Y$ and $-Y$ represent RF pulses selected to rotate said nuclear spins about a second axis orthogonal to said first axis and phase shifting said $+Y$ or $-Y$ pulses such that they rotate said nuclear spins about the first axis by $-\pi/2$ radians.

15. A method as defined in claim 11 wherein said phase difference of 180° is obtained solely from a quadrature modulator.

16. A method as defined in claim 11 wherein said phase difference of 180° is obtained as the sum of phase shifts from a quadrature modulator and a direct digital synthesizer.

17. A method as defined in claim 11 wherein said first RF pulse set comprises multiples of four $\pi/2$ pulses and said second RF pulse set comprises multiples of four $\pi/2$ pulses.

18. A method as defined in claim 11 wherein the step of sensing said transverse magnetization includes sensing a zero magnetization level corresponding to the initial position of said nuclei or to rotation from the initial position by 180°, a first magnetization level corresponding to rotation of said nuclei from the initial position by 90°, and a second magnetization level corresponding to rotation of said nuclei from the initial position by 270°, the second magnetization level being equal in magnitude and opposite in polarity with respect to said first magnetization level when the amplitudes of the first and second pulse sets are equal.

19. A method as defined in claim 11 wherein said first and second pulse sets are continuously applied to said nuclei for a predetermined time.

20. A method as defined in claim 18 wherein the step of adjusting the first pulse amplitude includes adjusting the amplitudes such that each of said magnetization levels remains constant as said pulse sets are repeated.

21. A method as defined in claim 11 further including the step of adjusting the amplitudes of said first and second pulse sets to produce rotation of said nuclear spins by $\pi/2$ radians.

22. In an NMR spectrometer in which NMR active nuclei are placed in a main static magnetic field and pulsed radio frequency (RF) fields are applied to said nuclei to excite nuclear spins, a method for aligning the amplitudes of RF pulses generated in first and second channels, comprising the steps of:

generating in said first channel a first RF pulse set selected to rotate said nuclear spins about a first axis orthogonal to the main static magnetic field in a first direction from an initial position to successive discrete positions;

generating in said second channel a second RF pulse set selected to rotate said nuclear spins about said first axis in a second direction opposite to said first direction to successive discrete positions;

applying to said nuclei a pulse sequence comprising said first pulse set followed by said second pulse set;

sensing discrete magnetization levels of said nuclei produced by said pulse sequence along a second axis that is orthogonal to said first axis and to the main magnetic field, each of said discrete magnetization levels corresponding to one of the discrete positions of said nuclear spins or to the initial position; and aligning the amplitudes of at least one of said pulse sets, if necessary, such that the sensed discrete magnetization levels indicate that the amplitudes of said first and second pulse sets are equal.

* * * * *